(12) United States Patent
Nielson et al.

(10) Patent No.: US 11,513,272 B2
(45) Date of Patent: *Nov. 29, 2022

(54) WIRE GRID POLARIZER WITH SILANE PROTECTIVE COATING

(71) Applicant: Moxtek, Inc., Orem, UT (US)

(72) Inventors: Stew Nielson, Pleasant Grove, UT (US); Matt Linford, Orem, UT (US); Anubhav Diwan, Provo, UT (US); Matthew C. George, Murray, UT (US)

(73) Assignee: Moxtek, Inc., Orem, UT (US)

( * ) Notice: Subject to any disclaimer, the term of this patent is extended or adjusted under 35 U.S.C. 154(b) by 357 days.

This patent is subject to a terminal disclaimer.

(21) Appl. No.: 16/941,021

(22) Filed: Jul. 28, 2020

(65) Prior Publication Data

US 2020/0363577 A1 Nov. 19, 2020

Related U.S. Application Data

(63) Continuation of application No. 15/978,470, filed on May 14, 2018, now Pat. No. 10,761,252.

(51) Int. Cl.
*G02B 5/30* (2006.01)
*G02B 1/18* (2015.01)
(Continued)

(52) U.S. Cl.
CPC ........... *G02B 5/3058* (2013.01); *C09D 5/084* (2013.01); *C09D 183/02* (2013.01);
(Continued)

(58) Field of Classification Search
CPC ...... G02B 5/30; G02B 5/3025; G02B 5/3058; G02B 1/04; G02B 1/14; G02B 1/18;
(Continued)

(56) References Cited

U.S. PATENT DOCUMENTS 3,630,790 A 12/1971 Schmidt et al.
4,705,725 A 11/1987 Glajch et al.
(Continued)

FOREIGN PATENT DOCUMENTS

JP 2000086996 3/2000
JP 2014/085516 A 5/2014
(Continued)

*Primary Examiner* — Stephone B Allen
*Assistant Examiner* — Adam W Booher
(74) *Attorney, Agent, or Firm* — Thorpe, North & Western, LLP

(57) ABSTRACT

A wire grid polarizer (WGP) can have a conformal-coating to protect the WGP from at least one of the following: corrosion, dust, and damage due to tensile forces in a liquid on the WGP. The conformal-coating can include a silane conformal-coating with chemical formula (1), chemical formula (2), or combinations thereof:

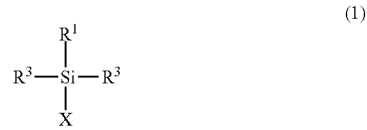

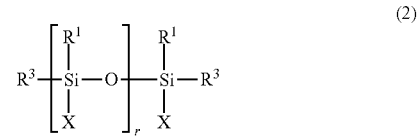

A method of applying a conformal-coating over a WGP can include exposing the WGP to $Si(R^1)_d(R^2)_e(R^3)_g$. In the above WGP and method, X can be a bond to the ribs; each $R^1$ can be a hydrophobic group; each $R^3$, if any, can be any chemical element or group; d can be 1, 2, or 3, e can be 1, (Continued)

2, or 3, g can be 0, 1, or 2, and d+e+g=4; $R^2$ can be a silane-reactive-group; and each $R^6$ can be an alkyl group, an aryl group, or combinations thereof.

20 Claims, 6 Drawing Sheets

(51) Int. Cl.

| | |
|---|---|
| *G02B 1/14* | (2015.01) |
| *G02B 1/04* | (2006.01) |
| *C23C 14/08* | (2006.01) |
| *C23C 14/06* | (2006.01) |
| *C23C 16/40* | (2006.01) |
| *C23C 16/34* | (2006.01) |
| *C23C 16/30* | (2006.01) |
| *C23C 16/32* | (2006.01) |
| *C09D 183/04* | (2006.01) |
| *C09D 5/08* | (2006.01) |
| *C09D 183/02* | (2006.01) |
| *C09D 185/02* | (2006.01) |
| *C23C 16/455* | (2006.01) |
| *B05D 5/08* | (2006.01) |
| *B05D 1/00* | (2006.01) |

(52) U.S. Cl.
CPC ......... *C09D 183/04* (2013.01); *C09D 185/02* (2013.01); *C23C 14/0635* (2013.01); *C23C 14/0652* (2013.01); *C23C 14/0676* (2013.01); *C23C 14/08* (2013.01); *C23C 14/081* (2013.01); *C23C 14/083* (2013.01); *C23C 16/308* (2013.01); *C23C 16/325* (2013.01); *C23C 16/345* (2013.01); *C23C 16/401* (2013.01); *C23C 16/403* (2013.01); *C23C 16/405* (2013.01); *C23C 16/45555* (2013.01); *G02B 1/04* (2013.01); *G02B 1/14* (2015.01); *G02B 1/18* (2015.01); *B05D 1/60* (2013.01); *B05D 5/08* (2013.01)

(58) Field of Classification Search
CPC .......... C09D 5/08; C09D 5/082; C09D 5/084; C09D 183/02; C09D 183/04; C09D 185/02; C23C 14/0635; C23C 14/0652; C23C 14/0676; C23C 14/08; C23C 14/081; C23C 14/083; C23C 16/308; C23C 16/325; C23C 16/345; C23C 16/401; C23C 16/403; C23C 16/405; C23C 16/45555; B05D 1/60; B05D 5/08
See application file for complete search history.

(56) References Cited

U.S. PATENT DOCUMENTS

| | | |
|---|---|---|
| 4,759,611 A | 7/1988 | Downey, Jr. |
| 5,045,347 A | 8/1991 | Gribbin et al. |
| 5,455,367 A | 10/1995 | Klein et al. |
| 6,447,120 B1 | 8/2002 | Hansen et al. |
| 6,585,378 B2 | 7/2003 | Kurtz et al. |
| 6,785,050 B2 | 8/2004 | Lines et al. |
| 7,189,479 B2 | 3/2007 | Lu et al. |
| 7,697,108 B2 | 4/2010 | Nam et al. |
| 7,961,393 B2 | 4/2011 | Perkins et al. |
| 8,654,289 B2 | 2/2014 | Park |
| 8,797,643 B2 | 8/2014 | Shin |
| 9,995,864 B2 * | 6/2018 | Diwan ................. C09D 183/02 |
| 10,054,717 B2 * | 8/2018 | Wangensteen ........... G02B 1/14 |
| 10,534,120 B2 * | 1/2020 | Nielson ................... C23C 16/44 |
| 2003/0102286 A1 | 6/2003 | Takahara et al. |
| 2003/0157391 A1 | 8/2003 | Coleman et al. |
| 2003/0180024 A1 | 9/2003 | Edlinger et al. |
| 2003/0227678 A1 | 12/2003 | Lines |
| 2004/0256223 A1 | 12/2004 | Katayama et al. |
| 2006/0264650 A1 | 11/2006 | Arora |
| 2007/0242352 A1 | 10/2007 | MacMASTER |
| 2007/0252293 A1 | 11/2007 | Sato et al. |
| 2008/0015298 A1 | 1/2008 | Xiong et al. |
| 2008/0117510 A1 | 5/2008 | Cheong et al. |
| 2008/0131709 A1 | 6/2008 | Hanson et al. |
| 2008/0143906 A1 | 6/2008 | Allemand et al. |
| 2008/0245273 A1 | 10/2008 | Vyorkka et al. |
| 2009/0087684 A1 | 4/2009 | Omura et al. |
| 2009/0109377 A1 | 4/2009 | Sawaki et al. |
| 2009/0155513 A1 | 6/2009 | Yoneyama et al. |
| 2010/0062189 A1 | 3/2010 | Yosomiya et al. |
| 2011/0052802 A1 | 3/2011 | Kaida et al. |
| 2011/0096396 A1 | 4/2011 | Kaida |
| 2011/0186790 A1 | 8/2011 | Wilezek |
| 2011/0189382 A1 | 8/2011 | Wilczek |
| 2011/0200826 A1 | 8/2011 | Wilezek |
| 2012/0107530 A1 | 5/2012 | Morishima |
| 2012/0219801 A1 | 8/2012 | Huang |
| 2012/0251797 A1 | 10/2012 | Smith et al. |
| 2013/0128358 A1 | 5/2013 | Hanashima |
| 2013/0250411 A1 | 9/2013 | Bangerter et al. |
| 2013/0258471 A1 | 10/2013 | Davis |
| 2014/0050909 A1 | 2/2014 | Choi et al. |
| 2014/0063467 A1 | 3/2014 | Takahashi et al. |
| 2015/0053914 A1 | 2/2015 | Kurtin et al. |
| 2015/0077851 A1 | 3/2015 | Wang et al. |
| 2016/0291208 A1 | 10/2016 | Wangensteen |
| 2016/0291227 A1 | 10/2016 | Nielson |
| 2017/0293059 A1 | 10/2017 | Nielson |
| 2018/0267221 A1 | 9/2018 | Oowada et al. |

FOREIGN PATENT DOCUMENTS

| | | |
|---|---|---|
| WO | WO2003/096105 | 11/2003 |
| WO | WO2008/039959 | 4/2008 |
| WO | WO2010/005059 | 1/2010 |
| WO | WO2014/012052 | 1/2014 |
| WO | WO2016/160786 | 10/2016 |

* cited by examiner

WIRE GRID POLARIZER WITH SILANE PROTECTIVE COATING

CLAIM OF PRIORITY

This application is a continuation of U.S. patent application Ser. No. 15/978,470, filed on May 14, 2018; which is a continuation of U.S. patent application Ser. No. 15/078,695, filed on Mar. 23, 2016; which claims priority to U.S. Provisional Patent Application Nos. 62/142,854, filed on Apr. 3, 2015; 62/190,188, filed on Jul. 8, 2015; 62/216,782, filed on Sep. 10, 2015; 62/209,024, filed on Aug. 24, 2015; 62/242,883, filed on Oct. 16, 2015; and 62/265,773, filed on Dec. 10, 2015, which are hereby incorporated herein by reference in their entirety.

FIELD OF THE INVENTION

The present application is related generally to wire grid polarizers.

BACKGROUND

Wire grid polarizers (WGPs or WGP for singular) can be used to divide light into two different polarization states. One polarization state can pass through the WGP and the other can be absorbed or reflected. The effectiveness or performance of WGPs is based on a very high percent transmission of one polarization (sometimes called Tp) and minimal transmission of an opposite polarization (sometimes called Ts). It can be beneficial to have high contrast (Tp/Ts). The percent reflection of the opposite polarization (Rs) can also be an important indicator of polarizer performance.

Ribs or wires of WGPs, especially for polarization of visible or ultraviolet light, can have small, delicate ribs with nanometer-sized pitch, wire-width, and wire-height. WGPs are used in systems (e.g. computer projectors, semiconductor inspection tools, etc.) that require high performance. Small defects in the WGP, such as dust, corroded ribs, and collapsed ribs can significantly degrade system performance (e.g. distorted image from a computer projector). Oxidation can degrade performance by adversely affecting contrast or Rs. Therefore, it can be important to protect the ribs from corrosion, oxidation, mechanical damage, and dust.

Water can condense or drop only onto limited portions of a WGP. Because the water can be in one channel but not in an adjacent channel, forces in the water can cause ribs to topple over, thus damaging the WGP.

WGP performance can also degrade by corrosion. Water can condense onto the WGP and wick into narrow channels between ribs due to capillary action. The water can then corrode the ribs. Corroded regions can have reduced contrast, changed Rs, or can fail to polarize at all.

Oxidization of the ribs can also degrade WGP performance. For example, as an aluminum wire forms a natural oxide over time, the underlying, substantially-pure aluminum is consumed, thus reducing the size of the substantially-pure aluminum wire and changing polarization characteristics of the WGP.

Protective coatings have been applied by dipping the WGP in an aqueous solution containing the coating. The coating can adhere to the ribs, then the WGP can be removed from the aqueous solution. Amino phosphonates, as described in U.S. Pat. No. 6,785,050, have commonly been applied in this manner. Application of protective coatings by this method has been reasonably successful for some wire materials, such as for example aluminum and silicon, but may be insufficient for WGP protection in extreme environments. Silicon is used in selectively-absorptive WGPs to absorb one polarization of light, and thus reduce Rs. The performance of such silicon-containing WGPs can degrade over time as shown by gradually-increasing Rs.

Protective coatings can adversely affect polarizer performance. For example, the coating can cause a reduction of Tp. Thicker coatings may be needed for to provide sufficient oxidation or corrosion protection, but thinner coatings may be preferred in order to minimize performance degradation by the coating.

SUMMARY

It has been recognized that it would be advantageous to (1) protect wire grid polarizers (WGPs or WGP for singular) from oxidation, corrosion, and dust; (2) protect wire grid polarizers from damage due to tensile forces in a liquid on the wire grid polarizer; and (3) reduce wire grid polarizer performance degradation over time.

The present invention is directed to various embodiments of WGPs with protective coatings, and methods of making WGPs with protective coatings, that satisfy these needs. Each embodiment may satisfy one, some, or all of these needs.

The WGP can comprise ribs located over a surface of a transparent substrate with gaps between at least a portion of the ribs. A silane conformal-coating can be located over the ribs. The silane conformal-coating can include chemical formula (1), chemical formula (2), or combinations thereof:

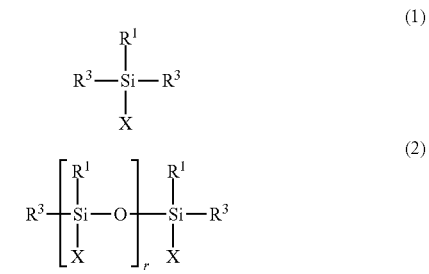

The method of making a WGP can comprise (1) obtaining ribs located over a surface of a transparent substrate, the ribs being elongated, substantially parallel, and situated in an array, with gaps between at least a portion of the ribs, and (2) exposing the WGP to a silane chemical. The silane chemical can include $Si(R^1)_d(R^2)_e(R^3)_g$.

In the above WGP and method, X can be a bond to the ribs; each $R^1$ can be independently a hydrophobic group; each $R^3$, if any, can be independently any suitable chemical element or group; d can be 1, 2, or 3, e can be 1, 2, or 3, g can be 0, 1, or 2, and d+e+g=4; $R^2$ can be a silane-reactive-group; each silane-reactive-group can be independently selected from: —C, —$OR^6$, —$OCOR^6$, —$N(R^6)_2$, and —OH; and each $R^6$ can be independently an alkyl group, an aryl group, or combinations thereof.

Figure 4:
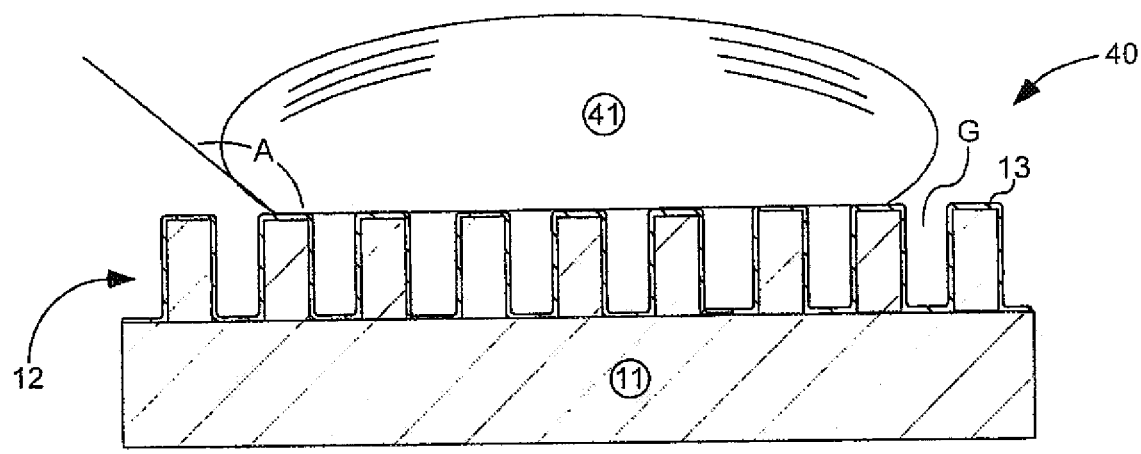

FIG. 4 is a schematic cross-sectional side view of a WGP 40 with a conformal-coating 13, including a hydrophobic-layer, designed to keep water 41, on a surface of the ribs 12, in a Cassie-Baxter state, in accordance with an embodiment of the present invention.

Figure 5:
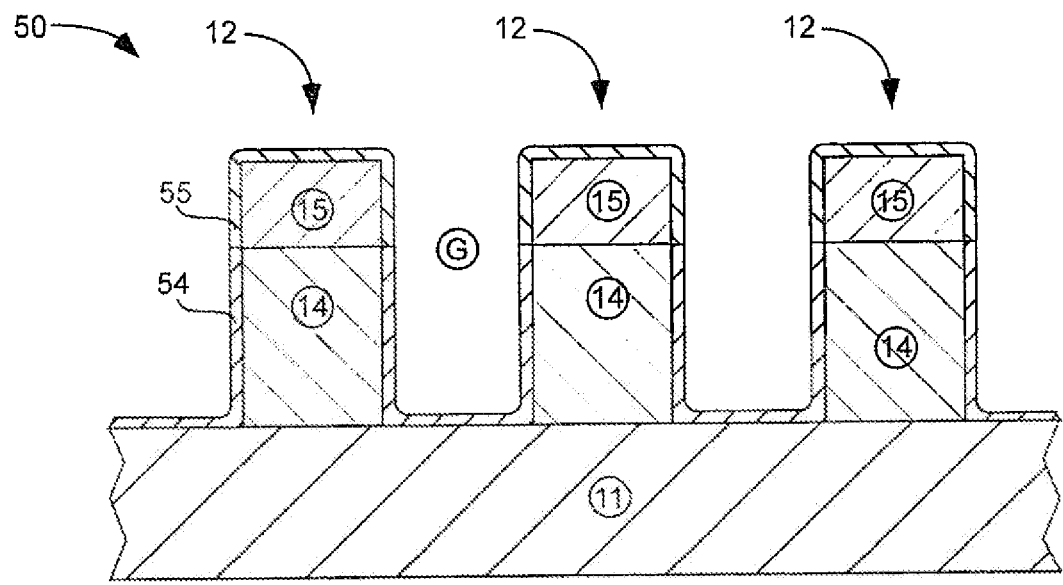

FIG. 5 is a schematic cross-sectional side view of a WGP 10 with array of ribs 12 located over a surface of a transparent substrate 11, in accordance with an embodiment of the present invention. Each of the ribs 12 can include different regions 14 and 15 with different materials. A conformal-coating 55 with one chemistry can adhere to one region 15 and a conformal-coating 54 with a different chemistry can adhere to a different region 14.

Figure 6:
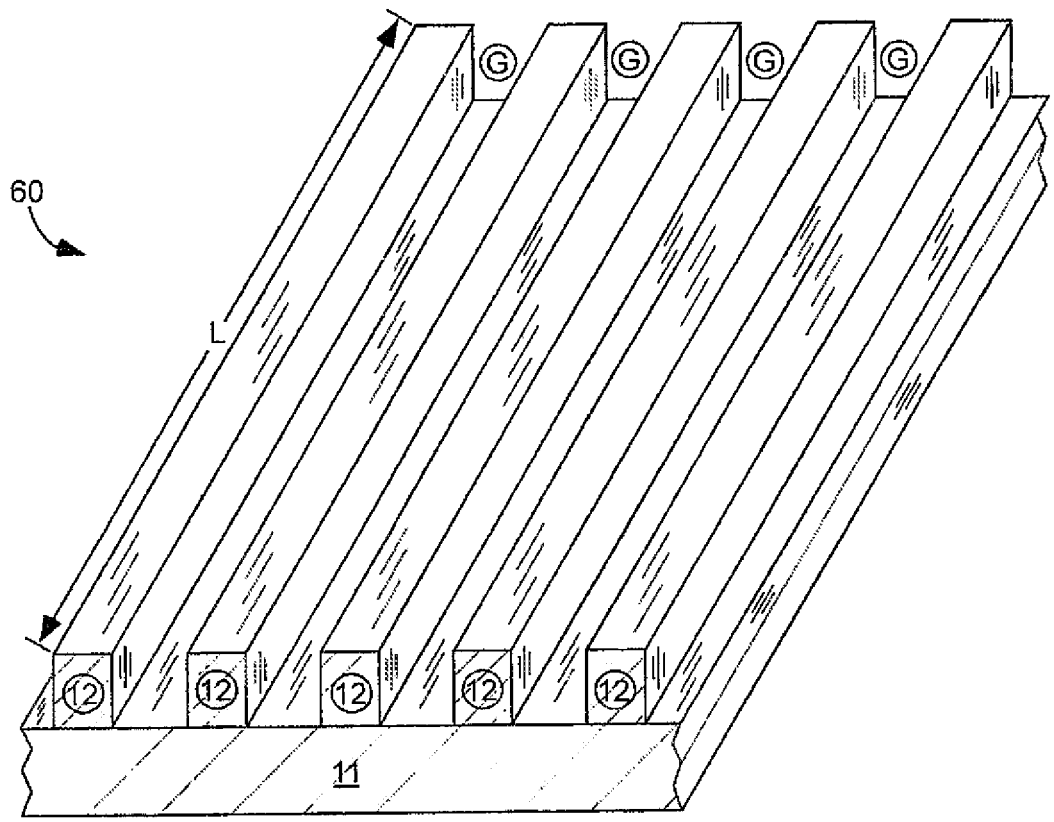

FIG. 6 is a schematic perspective-view of a WGP in accordance with an embodiment of the present invention.

Figure 7:
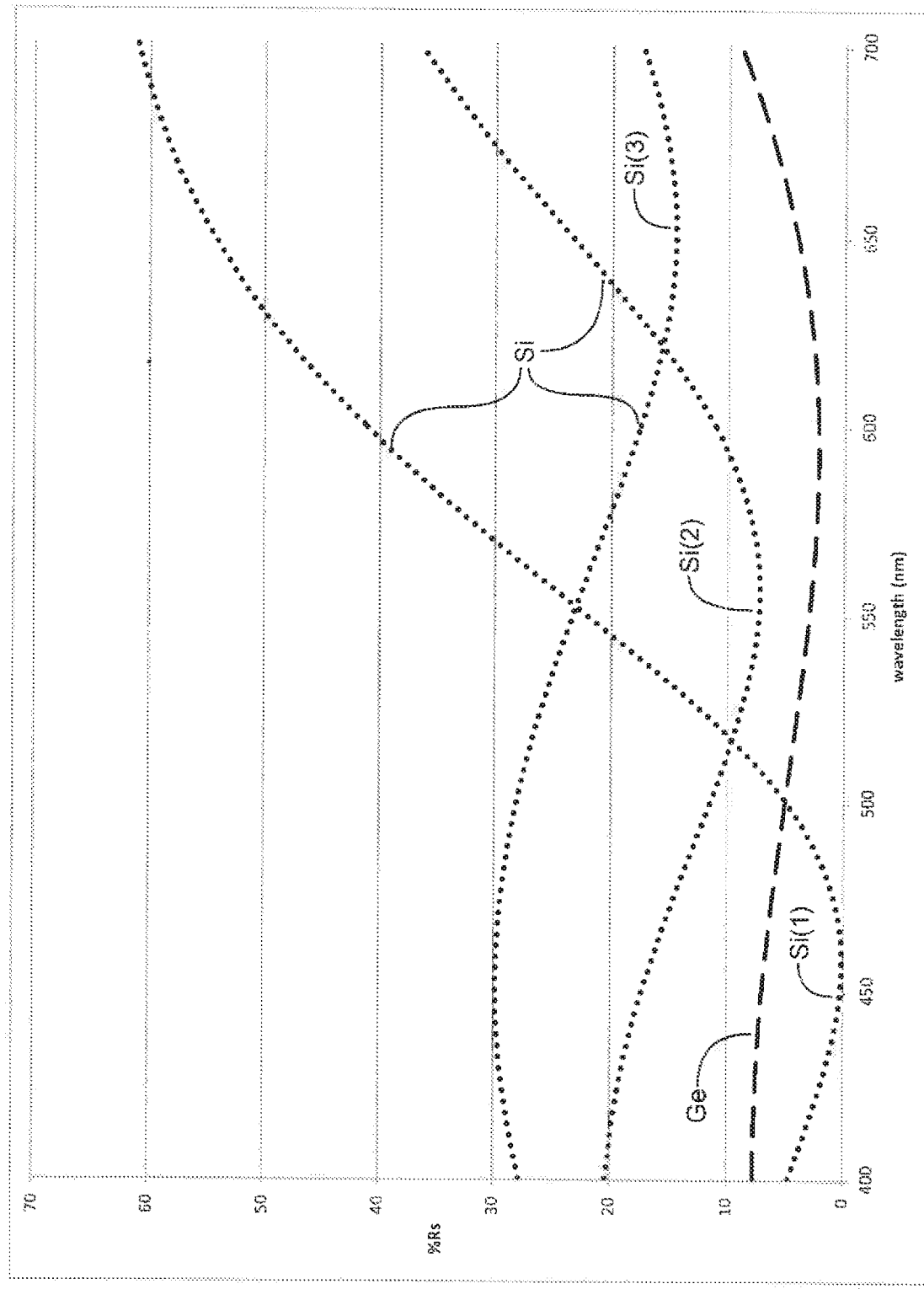

FIG. 7 is a graphical plot of the relationship between wavelength and reflectance of one polarization (Rs) in: (1) a WGP that includes germanium, in accordance with an embodiment of the present invention; and (2) WGPs that include silicon, in accordance with the prior-art.

Figure 8:
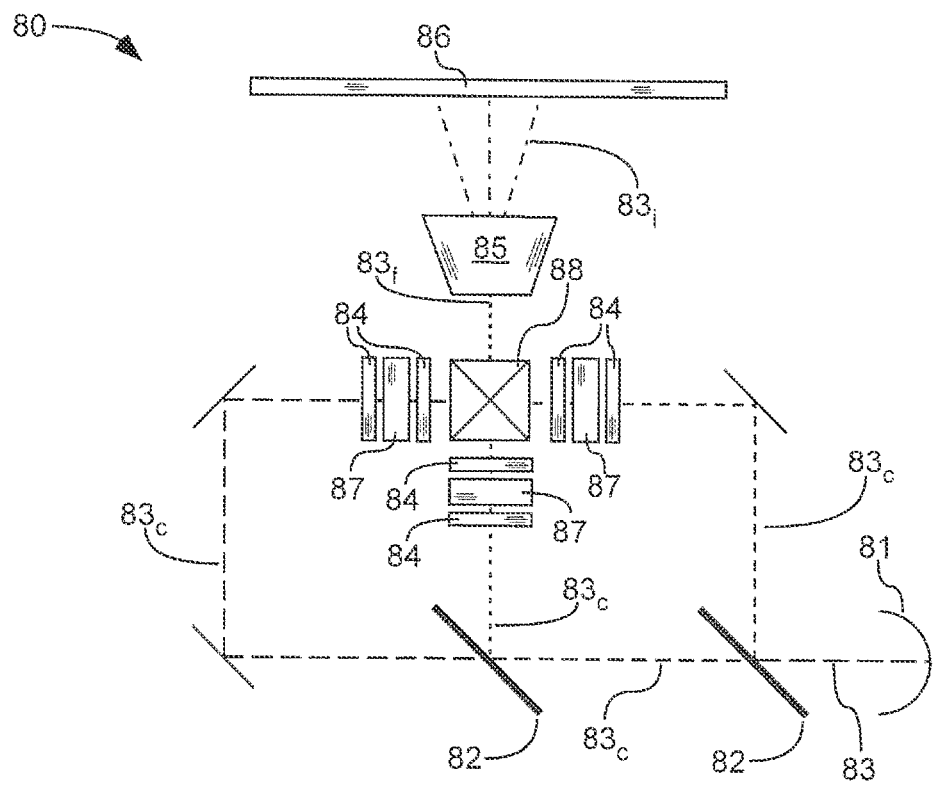
Figure 9:
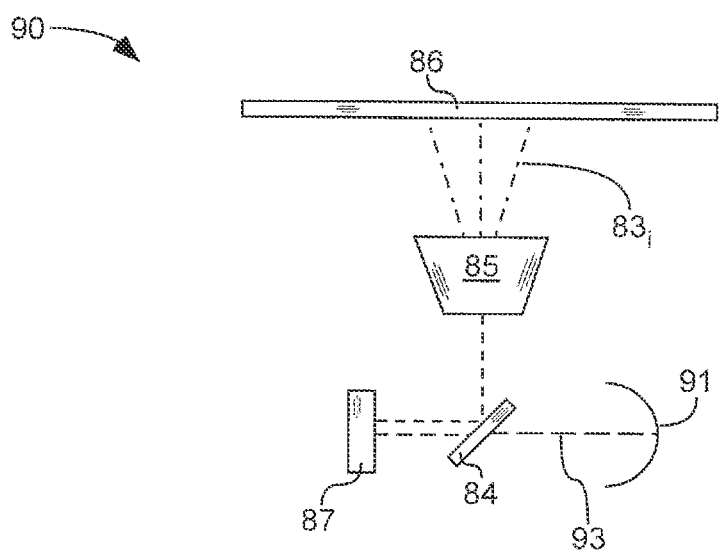

FIGS. 8-9 are schematic views of image projectors 80 and 90 with broadband, selectively-absorptive, WGPs 84, in accordance with embodiments of the present invention.

Figure 10:
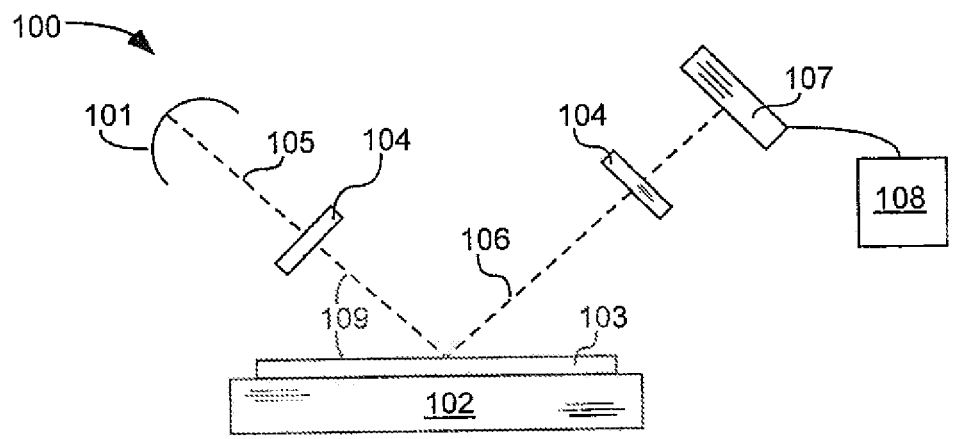

FIG. 10 shows an integrated circuit (IC) inspection tool 100 including a WGP 104, in accordance with embodiments of the present invention.

Figure 11:
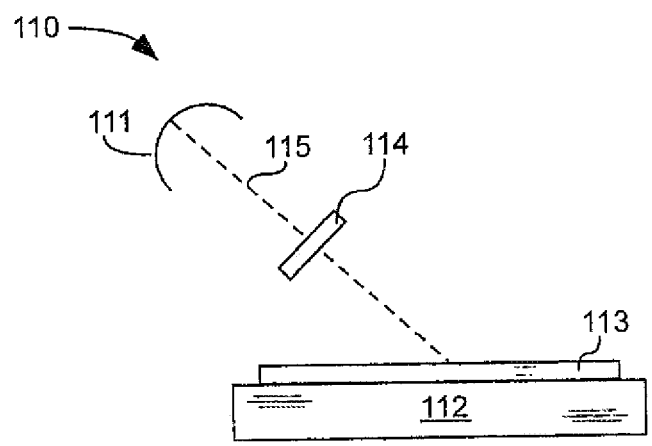

FIG. 11 shows a flat panel display (FPD) manufacturing tool 110 including a WGP 114, in accordance with an embodiment of the present invention.

DEFINITIONS

As used herein, "alkyl" refers to a branched, unbranched, or cyclic saturated hydrocarbon group. Alkyls include, but are not limited to, methyl, ethyl, n-propyl, isopropyl, n-butyl, isobutyl, t-butyl, octyl, and decyl, for example, as well as cycloalkyl groups such as cyclopentyl, and cyclohexyl, for example. The "alkyl" can typically be relatively small to facilitate vapor deposition, if overall atomic weight of the molecule is considered, such as for example ≤2 carbon atoms in one aspect, ≤3 carbon atoms in another aspect, ≤5 carbon atoms in another aspect, or ≤10 carbon atoms in another aspect. As used herein, "substituted alkyl" refers to an alkyl substituted with one or more substituent groups. The term "heteroalkyl" refers to an alkyl in which at least one carbon atom is replaced with a heteroatom. If not otherwise indicated, the term "alkyl" includes unsubstituted alkyl, substituted alkyl, and heteroalkyl.

As used herein, "aryl" refers to a group containing a single aromatic ring or multiple aromatic rings that are fused together, directly linked, or indirectly linked (such that the different aromatic rings are bound to a common group such as a methylene or ethylene moiety). Aryl groups include, for example, phenyl, naphthyl, anthryl, phenanthryl, biphenyl, diphenylether, diphenylamine, and benzophenone. The term "substituted aryl" refers to an aryl group comprising one or more substituent groups. The term "heteroaryl" refers to an aryl group in which at least one carbon atom is replaced with a heteroatom. If not otherwise indicated, the term "aryl" includes unsubstituted aryl, substituted aryl, and heteroaryl.

As used herein, the phrase "bond to the ribs" or similar phrases (e.g. "Z is a bond to the ribs") can mean a direct bond between the chemical and the ribs or a bond to an intermediate layer which is bonded directly, or through other layer(s) to the ribs. Thus, these layer(s) can be other conformal-coating(s).

As used herein, the term "carbon chain" means a chain of carbon atoms linked together, including at least three carbon atoms in a row (e.g. —C—C—C—, —C=C—C—, etc.). The term carbon chain can include at least five carbon atoms in a row in one aspect, at least ten carbon atoms in a row in another aspect, or at least fifteen carbon atoms in a row in another aspect. The term carbon chain can also include ether linkages (C—O—C moieties). The term carbon chain includes single, double, and triple carbon to carbon bonds. The carbon atoms can be attached to any element or molecule.

Figure 1:
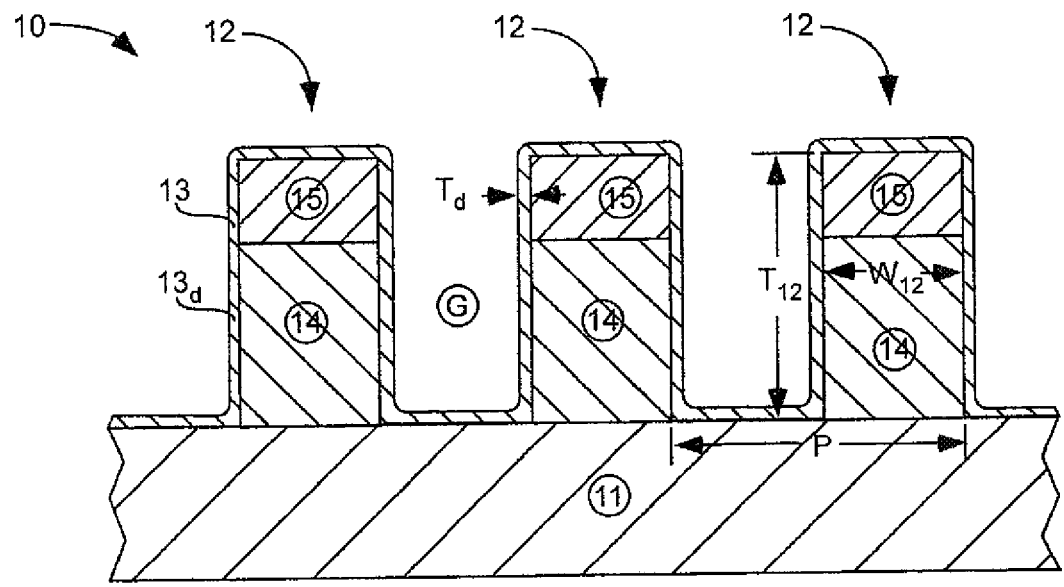
FIGS. 1-3 are schematic cross-sectional side views of WGPs 10, 20, and 30, each with a conformal-coating 13 located over ribs 12, in accordance with embodiments of the present invention. The conformal-coating 13 in FIG. 1 includes a single layer—a distal conformal-coating $13_d$. The conformal-coating 13 in FIG. 2 includes two layers—a proximal conformal-coating $13_p$ and a distal conformal-coating $13_d$. The conformal-coating 13 in FIG. 3 includes three layers—a proximal conformal-coating $13_p$, a middle conformal-coating $13_m$, and a distal conformal-coating $13_d$.

The term "elongated" means that a length L (see FIG. 6) of the ribs 12 is substantially greater than rib width $W_{12}$ or rib thickness $T_{12}$ (see FIG. 1). For example, WGPs for ultraviolet or visible light can often have a rib width $W_{12}$ between 20 and 100 nanometers and rib thickness $T_1$ between 50 and 500 nanometers; and rib length L of about 1 millimeter to 20 centimeters or more, depending on the application. Thus, elongated ribs 12 can have a length L that is many times (even thousands of times) larger than rib width $W_{12}$ or rib thickness $T_{12}$.

As used herein, the term "gap" means a space, opening, or divide, separating one rib from another rib. The gap can be filled with a vacuum, gas, liquid, or solid, unless otherwise specified.

As used herein, the unit "sccm" means cubic centimeters per minute at 0° C. and 1 atmosphere pressure.

As used herein, the term "substrate" includes a base material, such as for example a glass wafer. The term "substrate" includes a single material, and also includes multiple materials (e.g. layered, composite, or the like), such as for example a glass wafer with at least one thin film on a surface of the wafer used together as the base material.

Many materials used in optical structures absorb some light, reflect some light, and transmit some light. The following definitions are intended to distinguish between materials or structures that are primarily absorptive, primarily reflective, or primarily transparent. Each material can be primarily absorptive, primarily reflective, or primarily transparent in a specific wavelength of interest (e.g. ail or a portion of the ultraviolet, visible, or infrared spectrums of light) and can have a different property in a different wavelength of interest.

1. As used herein, the term "absorptive" means substantially absorptive of light in the wavelength of interest.
    a. Whether a material is "absorptive" is relative to other materials used in the polarizer. Thus, an absorptive structure will absorb substantially more than a reflective or a transparent structure.
    b. Whether a material is "absorptive" is dependent on the wavelength of interest. A material can be absorptive in one wavelength range but not in another.
    c. In one aspect, an absorptive structure can absorb greater than 40% and reflect less than 60% of light in the wavelength of interest (assuming the absorptive structure is an optically thick film—i.e. greater than the skin depth thickness).
    d. In another aspect, an absorptive material can have a high extinction coefficient (k), relative to a transparent material, such as for example greater than 0.01 in one aspect or greater than 1.0 in another aspect.

e. Absorptive ribs can be used for selectively absorbing one polarization of light.
2. As used herein, the term "reflective" means substantially reflective of light in the wavelength of interest.
   a. Whether a material is "reflective" is relative to other materials used in the polarizer. Thus, a reflective structure will reflect substantially more than an absorptive or a transparent structure.
   b. Whether a material is "reflective" is dependent on the wavelength of interest. A material can be reflective in one wavelength range but not in another. Some wavelength ranges can effectively utilize highly reflective materials. At other wavelength ranges, especially lower wavelengths where material degradation is more likely to occur, the choice of materials may be more limited and an optical designer may need to accept materials with a lower reflectance than desired.
   c. In one aspect, a reflective structure can reflect greater than 80% and absorb less than 20% of light in the wavelength of interest (assuming the reflective structure is an optically thick film—i.e. greater than the skin depth thickness).
   d. Metals are often used as reflective materials.
   e. Reflective wires can be used for separating one polarization of light from an opposite polarization of light.
3. As used herein, the term "transparent" means substantially transparent to light in the wavelength of interest.
   a. Whether a material is "transparent" is relative to other materials used in the polarizer. Thus, a transparent structure will transmit substantially more than an absorptive or a reflective structure.
   b. Whether a material is "transparent" is dependent on the wavelength of interest. A material can be transparent in one wavelength range but not in another.
   c. In one aspect, a transparent structure can transmit greater than 90% and absorb less than 10% of light at the wavelength of interest or wavelength range of use, ignoring Fresnel reflection losses.
   d. In another aspect, a transparent structure can have an extinction coefficient (k) of less than 0.01, less than 0.001, or less than 0.0001 in another aspect, at the wavelength of interest or wavelength range of use.
4. As used in these definitions, the term "material" refers to the overall material of a particular structure. Thus, a structure that is "absorptive" is made of a material that as a whole is substantially absorptive, even though the material may include some reflective or transparent components. Thus for example, a rib made of a sufficient amount of absorptive material so that it substantially absorbs light is an absorptive rib even though the rib may include some reflective or transparent material embedded therein.

DETAILED DESCRIPTION

As illustrated in FIGS. 1-6, wire grid polarizers (WGPs or WGP for singular) 10, 20, 30, 40, 50, and 60 are shown comprising ribs 12 located over a surface of a transparent substrate 11. The ribs 12 can be elongated and arranged in a substantially parallel array. In some embodiments, the ribs 12 can have a small pitch P (see FIG. 1), such as for example a pitch P of less than 200 nanometers in one aspect or less than 150 nanometers in another aspect.

There can be gaps G between at least a portion of the ribs 12 (i.e. a gap G between a rib 12 and an adjacent rib 12). The gaps G can be filled with air in one aspect, a liquid in another aspect, a transparent, solid, dielectric material in another aspect, or combinations thereof.

As shown in FIGS. 1-5, a conformal-coating 13 can be located over the ribs 12. The conformal-coating 13 can also be located over an exposed surface of the substrate 11 ("exposed surface" meaning a surface of the substrate not covered with ribs 12). Use of a conformal-coating 13 can be beneficial because by following a contour of the ribs 12 and an exposed surface of the substrate 11, conformal-coating thickness $T_p$, $T_m$, and $T_d$, can be minimized, thus reducing any detrimental effect of the conformal-coating(s) 13 on WGP performance. The conformal-coating 13 can cover an exposed surface of the ribs 12. The conformal-coating 13 can include a barrier-layer, a hydrophobic-layer, or both. The barrier-layer can include an oxidation-barrier, a moisture-barrier, or both.

The conformal-coating 13 can include a single layer (FIG. 1) or multiple, different layers (see FIGS. 2-3) across all or substantially all of the ribs 12. The conformal-coating 13 can include at least one of: a proximal conformal-coating $13_p$, a middle conformal-coating $13_m$, and a distal conformal-coating $13_d$. It can be important to have sufficient thickness $T_p$, $T_m$, and $T_d$ for each of these layers $13_p$, $13_m$, and $13_d$, respectively, of the conformal-coating 13, in order to provide sufficient protection to the ribs 12 and/or to provide a base for an upper layer of the conformal-coating 13. Thus, one or more of the proximal conformal-coating $13_p$, the middle conformal-coating $13_m$, and the distal conformal-coating $13_d$ can have a thickness $T_p$, $T_m$, or $T_d$ that is at least 0.1 in one aspect, at least 0.5 nanometers in another aspect, or at least 1 nanometer in another aspect.

It can be important to have a sufficiently small thickness $T_p$, $T_m$, and $T_d$ for each of these layers $13_p$, $13_m$, and $13_d$, respectively, of the conformal-coating 13, in order to avoid or minimize degradation of WGP performance caused by the conformal-coating 13. Thus, one or more of the proximal conformal-coating $13_p$, the middle conformal-coating $13_m$, and the distal conformal-coating $13_d$ can have a thickness $T_p$, $T_m$, or $T_d$ that is less than 2 nanometers in one aspect, less than 3 nanometers in another aspect, less than 5 nanometers in another aspect, less than 10 nanometers in another aspect, less than 15 nanometers in another aspect, or less than 20 nanometers in another aspect.

These thickness values can be a minimum thickness or a maximum thickness at any location of the conformal-coating 13, or simply a thickness at a location of the conformal-coating 13. Each layer of the conformal-coating 13 can be a monolayer.

Alternatively, as shown in FIG. 5, a conformal-coating 55 with one chemistry can adhere to one region 15 and a conformal-coating 54 with a different chemistry can adhere to a different region 14. The chemistry of multiple, different, conformal-coatings can be selected such that different regions of the WGP, with different chemistries, can be protected.

Hydrophobic-Layer Description

The conformal-coating 13 can include a hydrophobic-layer. The hydrophobic-layer can include a phosphonate conformal-coating, which can include:

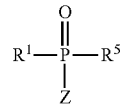

where each $R^1$ can independently be a hydrophobic group, Z can be a bond to the ribs, and Rs can be any suitable chemical element or group. $R^5$ can be a phosphonate-reactive-group, $R^1$, or $R^6$. The phosphonate-reactive-group can be a chemical element or group likely to react to form an additional bond Z to the ribs 12, such as for example —Cl, —$OR^6$, —$OCOR^6$, or —OH. Each $R^6$ can independently be an alkyl group, an aryl group, or combinations thereof.

The hydrophobic-layer can alternatively or in addition include a silane conformal-coating, which can include chemical formula (1), chemical formula (2), or combinations thereof:

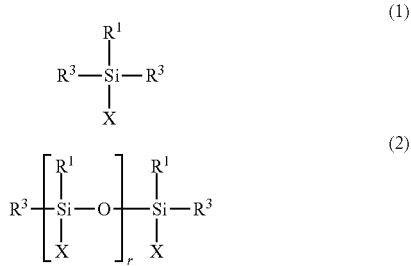

where r can be a positive integer, X can be a bond to the ribs, and each $R^3$ can be independently a chemical element or a group. Each $R^1$, as mentioned above, can independently be a hydrophobic group.

Each $R^3$ can be independently selected from the group consisting of: a silane-reactive-group, —H, $R^1$, and $R^6$. $R^6$ was defined above. Each silane-reactive-group can be independently selected from the group consisting of: —Cl, —$OR^6$, —$OCOR^6$, —$N(R^6)_2$, and —OH.

$R^3$ and/or $R^5$ can be a small group, such as for example —$OCH_3$, to allow easier vapor-deposition. Benefits of vapor-deposition are described below.

The hydrophobic-layer can alternatively or in addition include a sulfur conformal-coating, which can include:

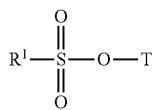

where T can be a bond to the ribs and each $R^1$, as mentioned above, can independently be a hydrophobic group.

Figure 2:
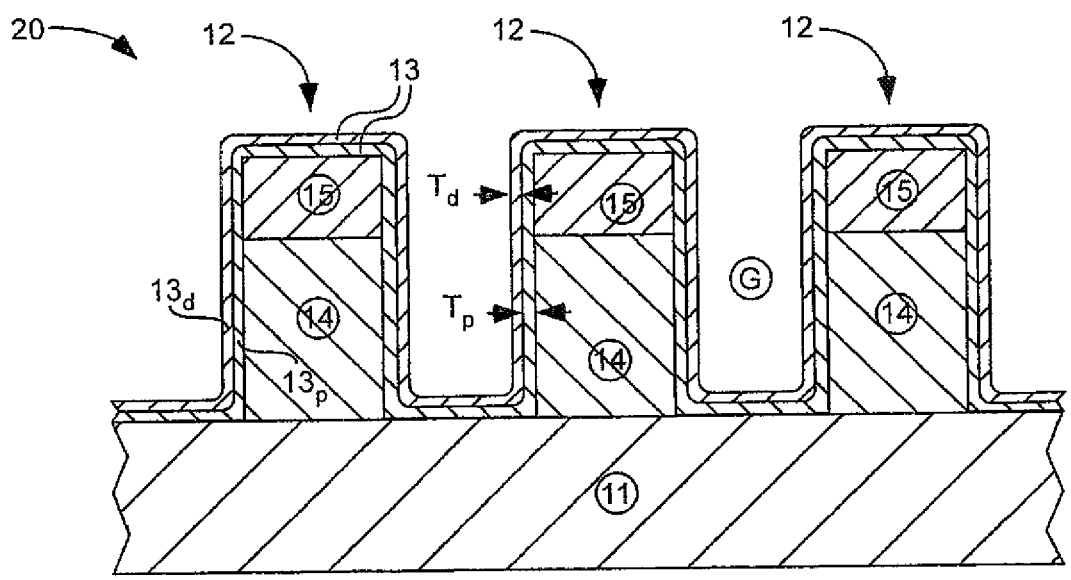
Figure 3:
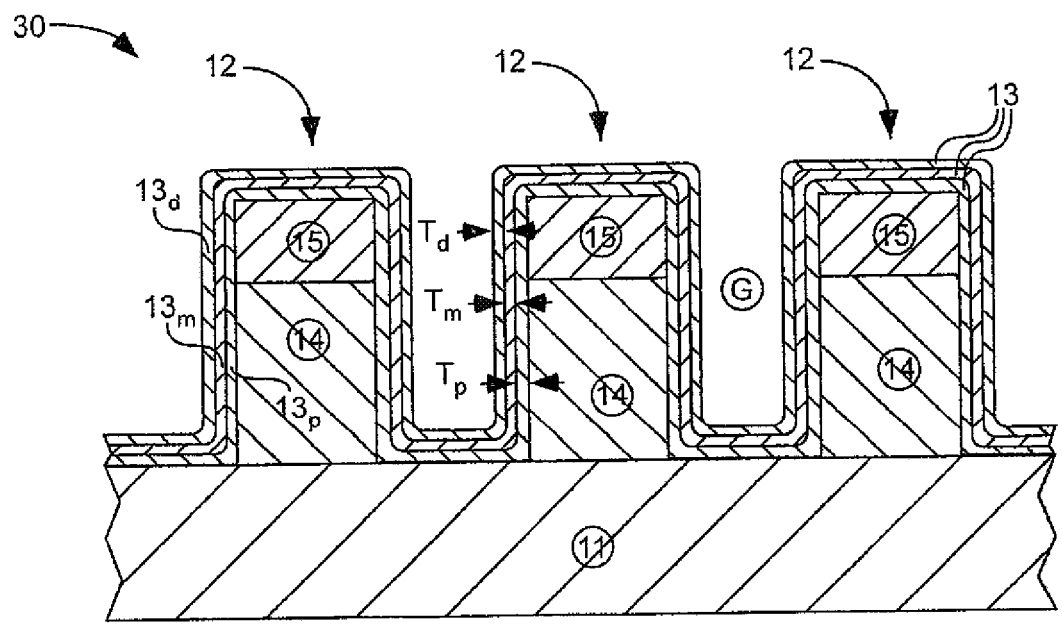

As shown in FIGS. 1-3, each rib 12 can include different regions 15 and 14, such as an upper-rib 15 and a lower-rib 14. The lower-rib 14 can be sandwiched between the upper-rib 15 and the substrate 11. At least one of these (lower-rib 14 or upper-rib 15) can be reflective (e.g. aluminum for visible light) and can be called a wire. At least one of these (lower-rib 14 or upper-rib 15) can be absorptive or transparent and can be called a rod. For example, for a selectively-absorptive WGP, with light incident from the rib 12 side, the rod can be absorptive and can be the upper-rib 15, and the wire can be the lower-rib 14. See U.S. Pat. No. 7,961,393 which is incorporated by reference herein.

It can be difficult to protect both the rod and the wire, because protective chemistry that adheres well for one might not adhere well to the other. At least two of the silane conformal-coating, the phosphonate conformal-coating, and the sulfur conformal-coating can be applied to the ribs 12. One of these can preferentially adhere to the rod and the other can preferentially adhere to the wire, thus providing effective protection to both. Money can be saved by using the phosphonate chemistry and the silane chemistry instead of just the silane conformal-coating because the phosphonate chemistry is presently less expensive than the silane chemistry. Thus, by combining the silane with the phosphonate, less of the expensive silane chemistry is needed. For example, the rod can be the upper-rib 15, can be made of silicon, and the silane conformal-coating 55 can preferentially adhere to the silicon upper-rib 15; and the wire can be the lower-rib 15, can be made of aluminum, and the phosphonate conformal-coating 54 can preferentially adhere to the aluminum lower-rib 15.

X can be a bond to the rod. For example, X can be —O—Si. T and/or Z can be a bond to the wire. For example, T and/or Z can be —O-Metal, where Metal is a metal atom. Thus, the silane conformal-coating can preferentially attach to one material (e.g. silicon) and the phosphonate conformal-coating or the sulfur conformal-coating can preferentially attach to another material (e.g. a metal) to provide protection to multiple rib 12 materials.

It can be beneficial if the chemicals in the hydrophobic-layer include molecules that each has multiple bonds T, Z, and/or X to the ribs 12. By each molecule forming multiple bonds X, more of the underlying surface (e.g. rib 12, proximal conformal-coating $13_p$, or middle conformal-coating $13_m$) can be bound and thus unavailable for bonding or interaction with undesirable chemicals, such as water for example. Also, multiple bonds to the surface can improve resiliency of the hydrophobic-layer because it can be less likely for multiple bonds Z/X/T to fail than for a single bond Z/X/T to fail.

Thus, $R^1$ can be:

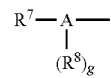

where A is a central atom, $R^7$ can be a hydrophobic group as described above, g can be an integer from 1 to 3, and $R^8$ can be moiety (1), moiety (2), moiety (3), or combinations thereof:

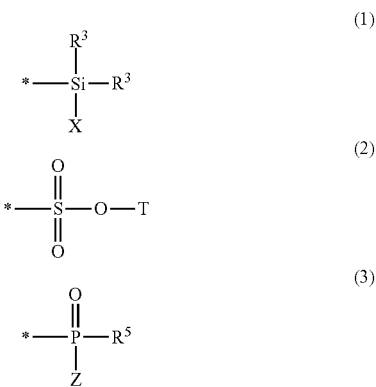

$R^3$ and $R^5$ were described above. The central atom A can be selected from group III, IV, or V in the periodic table in one aspect or can be selected from the group consisting of carbon, nitrogen, phosphorous, and silicon in another aspect.

For example, for g=2, the phosphonate conformal-coating, and moiety (3), the resulting chemical formula can be:

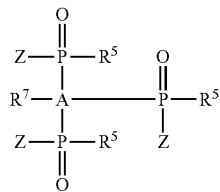

Another way for molecules in the hydrophobic-layer to form multiple bonds Z, and/or X to the ribs 12 is for $R^5$ to be Z and/or for $R^3$ to be X. This can be accomplished if, in the phosphonate chemistry as applied, $R^5$ is a phosphonate-reactive-group and/or if, in the silane chemistry as applied, $R^3$ is a silane-reactive-group.

The hydrophobic group can be or can include a carbon chain in one aspect and can include at least one halogen bonded to a carbon in another aspect. The carbon chain can include a perfluorinated group including at least 1 carbon atom in one aspect or at least 3 carbon atoms in another aspect. The perfluorinated group can include less than 20 carbon atoms in another aspect, less than 30 carbon atoms in another aspect, or less than 40 carbon atoms in another aspect. It can be beneficial for the perfluorinated group to have at least 4 carbon atoms to provide a hydrophobic chain. It can be beneficial for the perfluorinated group to not be too long or have too many carbon atoms in order to maintain a high enough vapor pressure to allow vapor-deposition.

For example, the carbon chain of $R^1$ can include $CF_3(CF_2)_n$. Due to the high electronegativity of fluorine, it can be beneficial to have a hydrocarbon chain to separate the perfluorinated group from the phosphorous or sulfur. Thus, the carbon chain of $R^1$ can include $CF_3(CF_2)_n(CH_2)_m$, where n can be an integer within the boundaries of $0 \leq n \leq 20$ in one aspect or $4 \leq n \leq 10$ in another aspect, and m can be an integer within the boundaries of $0 \leq m \leq 5$ in one aspect or $2 \leq m \leq 5$ in another aspect.

In order to allow vapor-deposition, it can be important for some or all of the conformal-coating chemistry to have a relatively lower molecular weight, but it can also be important for the carbon chain to be long enough to provide sufficient hydrophobicity. Thus, each molecule in the phosphonate conformal-coating (excluding the bond to the ribs Z), each molecule in the silane conformal-coating (excluding the bond to the ribs X), and/or each molecule in the sulfur conformal-coating (excluding the bond to the ribs T), can have a molecular weight of at least 100 grams per mole in one aspect, at least 150 grams per mole in another aspect, or at least 400 grams per mole in another aspect, and less than 600 grams per mole in one aspect, less than 1000 grams per mole in another aspect, or less than 1500 grams per mole in another aspect.

In the hydrophobic-layer, it can be important to have a strong bond between silicon (Si) and $R^1$, between phosphorous (P) and $R^1$, and/or between sulfur (S) and $R^1$, to avoid the $R^1$ group breaking away from Si, P, or S. Thus, the bond between silicon (Si) and $R^1$ can be a silicon to carbon bond (Si—C); the bond between phosphorous (P) and $R^1$ can be a phosphorous to carbon bond (P—C); and/or the bond between sulfur (S) and $R^1$ can be a sulfur to carbon bond (S—C).

The hydrophobic-layer located on the ribs 12 can provide a hydrophobic surface, which can be a superhydrophobic surface, depending on the chemistry and the structure of the ribs, such as pitch P and rib width $W_{12}$. As shown in FIG. 4, the WGP and conformal-coating 13 can include a hydrophobic-layer and can be capable of keeping water 41, on a surface of the ribs 12, in a Cassie-Baxter state. Having water on the WGP 10 in a Cassie-Baxter state can be beneficial because the water 41 does not substantially enter or remain in the gaps G, thus avoiding or reducing corrosion on sides of the ribs 12 and avoiding or reducing toppling of the ribs 12 due to water's tensile forces. Also, if the water 41 is in a Cassie-Baxter state, the water can more easily roll off the surface of the WGP, often carrying dust particles with it. A water contact angle A can be greater than 110° in one aspect, greater than 120° in another aspect, greater than 130° in another aspect, or greater than 140° in another aspect.

Soluble WGP Materials

As described above, at least one of the lower-rib 14 or upper-rib 15 can be reflective (e.g. aluminum for visible light) and can be called a wire and at least one can be absorptive or transparent and can be called a rod. The rod can be made of silicon, an absorptive material for visible light. Silicon-containing, selectively-absorptive WGPs have been used in image projectors. Selectively-absorptive WGPs can substantially allow one polarization (e.g. p-polarized light) to pass through and can absorb an opposite polarization (e.g. s-polarized light). In an image projector, the p-polarized light can be used for forming the image. Ghosting of the projected image can be reduced by the WGP absorbing the s-polarized light. Some image projectors separate light into three different light beams. One of these light beams can have a wavelength of about 450 nm, another can have a wavelength of about 550 nm, and the third can have a wavelength of about 650 nm. In order to optimize polarization of each light beam, different WGP designs can be used for each different light beam.

Graphical silicon-plots Si in FIG. 7 show the relationship between wavelength and reflectance of one polarization (e.g. reflectance of s-polarization Rs) of a selectively-absorptive WGP that includes silicon. The first silicon-plot Si(1) is for with a WGP having a silicon thickness selected for optimal (low) Rs at around 450 nanometers. The second silicon-plot Si(2) is for with a WGP having a silicon thickness selected for optimal (low) Rs at around 550 nanometers. The third silicon-plot Si(3) is for with a WGP having a silicon thickness selected for optimal (low) Rs at around 650 nanometers. It would be simpler, and manufacturing errors could be avoided, if less than three different WGP designs were required.

Also shown in FIG. 7 is a graphical germanium-plot Ge of the relationship between wavelength and reflectance of one polarization (e.g. s-polarization) of a selectively-absorptive WGP that includes germanium. The WGP that includes germanium has better Rs across ⅔ of wavelengths from 400-700 nm. Thus, use of a WGP that includes germanium can provide a benefit of improved Rs from about 500-700 nm. Another possible benefit is that, due to the flatness of the germanium-plot Ge, one WGP design can be used for at least two of the light beams (e.g. 550 and 650).

Another disadvantage of a selectively-absorptive WGP that includes silicon is that Rs tends to increase (worsen) over time, which can result in gradually deteriorating image-projection quality over time. Selectively-absorptive WGPs that include germanium, however, show the opposite—Rs decreases (improves) over time, thus avoiding deteriorating image-projection quality over time. Due to the reasonably good initial Rs across the entire visible spectrum, and decreasing Rs over time, a single selectively-absorptive WGP that includes germanium can be used across the entire visible spectrum.

In one embodiment, a rod in a selectively-absorptive WGP can include at germanium. For example, the rod can include at least 20 mass percent germanium in one aspect, at least 50 mass percent germanium in another aspect, at least 80 mass percent germanium in another aspect, or at least 95 mass percent germanium in another aspect.

A difficulty of using germanium, however, is that it has a soluble oxide (about 4.5 g/L at 25° C.). WGP performance can decrease if the polarizer, with an exterior of the rib 12 including germanium/germanium oxide, is immersed into an aqueous solution. Such aqueous solution can be for applying a protective coating (e.g. amino phosphonate as taught in U.S. Pat. No. 6,785,050 which is incorporated herein by reference). Such protective coatings can be important to avoid corrosion of the WGP.

Other desirable WGP materials can have the same problem as germanium and their performance can degrade by immersing in an aqueous solution. WGPs made with such water-soluble materials can also benefit from anhydrous-immersion and/or vapor-deposition for applying the conformal-coating(s) 13. For example, an anhydrous method can be helpful if a material of an exterior of the ribs 12 has solubility in water of at least 0.015 grams per liter at 25° C. in one aspect, at least 0.02 grams per liter at 25° C. in another aspect, at least 0.05 grams per liter at 25° C. in another aspect, at least 0.5 grams per liter at 25° C. in another aspect, at least 1 gram per liter at 25° C. in another aspect, at least 2 grams per liter at 25° C. in another aspect, or at least 4 grams per liter at 25° C. in another aspect.

Thus, at least for WGPs with materials that are soluble in water, it can be beneficial to have an anhydrous method for applying protective coatings, such as anhydrous-immersion or vapor-deposition. Non-limiting examples of vapor-deposition methods include chemical vapor-deposition (CVD), low-pressure CVD (LPCVD), plasma-enhanced CVD, physical vapor-deposition (PVD), atomic layer deposition (ALD), thermoreactive diffusion, electron-beam deposition, sputtering, and thermal evaporation. Anhydrous-immersion can include submersion of the WGP in an anhydrous, liquid bath. A solvent that will not dissolve rib 12 materials can be selected. Vapor-deposition can be preferred over immersion because of reduced process-waste disposal problems, reduced health hazards, reduced or no undesirable residue from rinsing, and vapor-deposition can be done with standard semiconductor processing equipment.

The oxidation-barrier and the moisture-barrier described below can be applied by ALD. Some embodiments of the hydrophobic-layer have a sufficiently-high vapor pressure and can be applied by vapor-deposition.

Oxidation-Barrier and Moisture-Barrier

The conformal-coating 13 can include a barrier-layer. The barrier-layer can include an oxidation-barrier, a moisture-barrier, or both. The barrier-layer can include a metal oxide, or layers of different metal oxides.

Oxidation of WGP ribs 12 can degrade performance of the WGP, by adversely affecting contrast or Rs. An oxidation-barrier can reduce oxidation of the ribs 12, and thus reduce or avoid such WGP performance degradation. The term "oxidation-barrier" means a first material capable of reducing the ingress of oxygen into a second material, which may cause the second material to oxidize. An oxidation barrier can be placed on the ribs 12 to protect the ribs 12 from oxidation. Non-limiting examples of chemicals that can be used as an oxidation-barrier include: aluminum oxide, silicon oxide, silicon nitride, silicon oxynitride, silicon carbide, or combinations thereof.

WGP corrosion can degrade WGP performance. For example, water can condense onto the WGP and wick into narrow channels between ribs due to capillary action. The water can then corrode the ribs. Corroded regions can have reduced contrast, changed Rs, or can fail to polarize at all. A moisture-barrier can resist corrosion. A moisture-barrier can protect the ribs 12 from water or other corrosion. Examples of chemicals that can be used as a moisture-barrier include, but are not limited to: hafnium oxide, zirconium oxide, or combinations thereof.

The barrier-layer can include rare earth oxides, for example, oxides of scandium, yttrium, lanthanum, cerium, praseodymium, neodymium, promethium, samarium, europium, gadolinium, terbium, dysprosium, holmium, erbium, thulium, ytterbium, and lutetium. These rare earth oxides can be at least part of the oxidation-barrier, the moisture-barrier, or both.

The barrier-layer can be distinct from the ribs 12, meaning (1) there can be a boundary line or layer between the ribs 12 and the barrier-layer; or (2) there can be some difference of material of the barrier-layer relative to a material of the ribs 12. For example, a native aluminum oxide can form at a surface of aluminum ribs 12. A layer of aluminum oxide (oxidation-barrier) can then be applied to the ribs (e.g. by ALD). This added layer of aluminum oxide can be important, because a thickness and/or density of the native aluminum oxide can be insufficient for protecting a core of the ribs 12 (e.g. substantially pure aluminum) from oxidizing. In this example, although the oxidation-barrier ($Al_2O_3$) has the same material composition as a surface ($Al_2O_3$) of the ribs 12, the oxidation-barrier can still be distinct due to (1) a boundary layer between the oxidation-barrier and the ribs 12 and/or (2) a difference in material properties, such as an increased density of the oxidation-barrier relative to the native aluminum oxide.

Silicon Dioxide Conformal-Coating

A silicon dioxide conformal-coating can be located between the silane conformal-coating and the ribs 12. The silicon dioxide conformal-coating can help the silane conformal-coating 14 bond to the ribs 12. The silicon dioxide conformal-coating can be the proximal conformal-coating $13_p$, or the middle conformal-coating $13_m$, or an additional layer of the conformal-coating 13 located between the middle conformal-coating $13_m$ and the distal conformal-coating $13_d$.

Multiple Conformal-Coatings

The oxidation-barrier can be less effective at resisting corrosion. The moisture-barrier and/or hydrophobic-layer can be less effective at resisting oxidation. Thus, it can be beneficial to combine both an oxidation-barrier with a moisture-barrier and/or hydrophobic-layer.

Although the moisture-barrier can resist corrosion, it can eventually break down. Thus, it can be beneficial to minimize exposure of the moisture-barrier to water. A hydrophobic-layer can minimize or prevent condensed water on the WGP from attacking the moisture-barrier, thus extending the life of the moisture-barrier and the WGP. If the hydrophobic-layer perfectly covers the ribs 12, and never breaks down, then a moisture-barrier might not be needed. But, due to imperfections in manufacturing, there can be locations on the ribs 12 that are not covered, or less densely covered, by the hydrophobic-layer. The moisture-barrier can provide protection to these locations. Also, the hydrophobic-layer can break down over time. The moisture-barrier can provide protection after such breakdown. Therefore, it can be beneficial to combine both a moisture-barrier and a hydrophobic-layer.

If the hydrophobic-layer keeps water on the ribs 12 in a Cassie-Baxter state, then rib 12 damage, which could otherwise be caused by tensile forces in water in the gaps G, can be avoided. Also, the water can roll off the surface of the WGP, often carrying dust particles with it, in a self-cleaning fashion. These are added benefits of the hydrophobic-layer that might not be provided by the oxidation-barrier or the moisture-barrier.

Thus, it can be beneficial for improved WGP protection and/or for improved adhesion of an upper-layer of the conformal-coating 13, for the conformal-coating 13 to have multiple layers, which can include at least two of: an oxidation-barrier, a moisture-barrier, a silicon dioxide conformal-coating, and a hydrophobic-layer. This added protection, however, is not free. Each additional layer in the conformal-coating 13 can increase WGP cost, especially if more than one tool is required to apply the multiple layers of the conformal-coating 13. Thus, a determination of the number of layers in the conformal-coatings 13 can be made by weighing cost against desired protection.

WGP 10 in FIG. 1 includes a conformal-coating 13 with one layer: a distal conformal-coating $13_d$. The distal conformal-coating $13_d$ can be the oxidation-barrier, the moisture-barrier, or the hydrophobic-layer.

WGP 20 in FIG. 2 includes a conformal-coating 13 with two layers: a proximal conformal-coating $13_p$ located closer to the ribs 12 and substrate 11 and a distal conformal-coating $13_d$ located over the proximal conformal-coating $13_p$. The proximal conformal-coating $13_p$ and the distal conformal-coating $13_d$ can comprise oxidation-barrier(s), moisture-barrier(s), and/or hydrophobic-layer(s).

WGP 30 in FIG. 3 includes a conformal-coating 13 with three layers: the proximal conformal-coating $13_p$, the distal conformal-coating $13_d$, and a middle conformal-coating $13_m$ located between the proximal conformal-coating $13_p$ and the distal conformal-coating $13_d$. The proximal conformal-coating $13_p$, the middle conformal-coating $13_m$, and the distal conformal-coating $13_d$ can comprise oxidation-barrier(s), moisture-barrier(s), and/or hydrophobic-layer(s). Although not shown in the figures, there can be more than three layers in the conformal-coating 13.

Order of Conformal-Coating Layers

It can be beneficial to use the moisture-barrier over the oxidation-barrier (i.e. the oxidation-barrier is proximal and the moisture-barrier is distal or middle), thus the moisture-barrier can provide corrosion protection to the oxidation-barrier. The oxidation-barrier can provide a good substrate for deposition of the moisture-barrier, resulting in a less porous moisture-barrier. Thus, the same moisture protection may be obtained by a relatively thinner moisture-barrier. This can be important because the moisture-barrier can degrade WGP performance, but such degradation can be minimized by reduced moisture-barrier thickness. Furthermore, the moisture-barrier can provide an improved surface for attachment of the hydrophobic-layer (if used).

It can be beneficial for the hydrophobic-layer to be located over the barrier-layer (i.e. the hydrophobic-layer can be the distal conformal-coating $13_d$) in order to best keep moisture from entering the gaps G and to minimize or eliminate moisture exposure of the underlying layer(s) in the conformal-coating 13 (e.g. the proximal conformal-coating $13_p$ and also possibly the middle conformal-coating $13_m$).

Image Projector

The WGPs described herein can be used in an image projector. Image projector 80, as shown in FIG. 8, can comprise a light source 81, color-splitting optics 82, color-combining optics 88, a projection lens system 85, one or more spatial light modulators 87, and one or more WGPs 84.

The light source 81 can emit a beam of light 83, which can initially be unpolarized. The color-splitting optics 82 can be located to receive at least part of the beam of light 83 and can split the beam of light 83 into multiple, differently-colored light beams (colored beams) $83_c$. The colored beams $83_c$ can be primary colors.

Color-combining optics 88 can be located to receive and can recombine at least some of the colored beams $83_c$ into a combined beam or final beam $83_f$. Color-combining optics 88 are sometimes called X-Cubes, X-Cube prisms, X-prisms, light recombination prisms, or cross dichroic prisms. Color-combining optics 88 are used in computer projectors for combining different colors of light into a single image to be projected. X-Cubes are typically made of four right angle prisms, with dichroic coatings, that are cemented together to form a cube.

The projection lens system 85 can be located to receive the combined beam $83_f$ and can project a colored image $83_i$ onto a screen 86. Although other systems can be used, exemplary projection lens systems 85 are described in U.S. Pat. Nos. 6,585,378 and 6,447,120, which are hereby incorporated herein by reference in their entirety.

One spatial light modulator 87 can be located to receive, in each light path between the color-splitting optics 82 and the color-combining optics 88, one of the colored beams $83_c$. Each spatial light modulator 87 can have a plurality of pixels. Each pixel can receive a signal. The signal can be an electronic signal. Depending on whether or not each pixel receives the signal, the pixel can rotate a polarization of, or transmit or reflect without causing a change in polarization of, incident light. The spatial light modulator(s) 87 can be a liquid crystal device/display (LCD) and can be transmissive, reflective, or transflective.

Each WGP 84, according to one of the WGP designs described herein, can be located in one of the colored beams $83_c$ prior to entering the spatial light modulator 87, after exiting the spatial light modulator 87, or both. The WGP(s) 84 help form the colored image $83_i$ by transmitting, reflecting, or absorbing light of each pixel depending on the type of WGP 84 and whether each pixel received the signal.

Another type of image projector 90 is shown in FIG. 9, and can comprise a light source 91, a projection lens system 85, a spatial light modulator 87, and a WGP 84. The light source 91 can sequentially emit multiple, differently-colored light beams (colored beams) 93. The colored beams 93 can be primary colors. The projection lens system 85 can be located to receive the colored beams 93 and can project a colored image $83_i$ onto a screen 86. The projection lens system 85, spatial light modulator 87, WGP 84, colored image $83_i$, and screen 86 were described above.

The spatial light modulator 87 can be located to receive, in a light path between the light source 91 and the projection lens system 85, the colored beams 93. The WGP 84 can be located in the colored beams 93 prior to entering the spatial light modulator 87 and after exiting the spatial light modulator 87.

IC Inspection Tool

Integrated circuits (ICs or IC) can be made of semiconductor material and can include nanometer-sized features. ICs can be used in various electronic devices (e.g. computer, motion sensor, etc.). Defects in the IC can cause the electronic device to fail. Thus, inspection of the IC can be important for avoiding failure of the electronic device, while in use by the consumer. Such inspection can be difficult due to the small feature-size of IC components. Light, with small wavelengths (e.g. ultraviolet), can be used to inspect small feature-size components. It can be difficult to have sufficient contrast between these small feature-size components and defects or their surroundings. Use of polarized light can improve integrated circuit (IC) inspection contrast. It can be difficult to polarize the small wavelengths of light (e.g. ultraviolet/UV) used for IC inspection. Polarizers that can polarize such small wavelengths, and that can withstand exposure to high-energy wavelengths of light, may be needed.

The WGPs described herein can polarize small wavelengths of light (e.g. UV) and can be made of materials sufficiently durable to withstand exposure to such light. An IC inspection tool 100 is shown in FIG. 10, comprising a light source 101 and a stage 102 for holding an IC wafer 103. The light source 101 can be located to emit an incident light-beam 105 (e.g. visible, ultraviolet, or x-ray) onto the IC wafer 103. The incident light-beam 105 can be directed to the wafer 103 by optics (e.g. mirrors). The incident light-beam 105 can have an acute angle of incidence 109 with a face of the wafer 103. To improve inspection contrast, a WGP 104 (according to an embodiment described herein) can be located in, and can polarize, the incident light-beam 105.

A detector 107 (e.g. CCD) can be located to receive an output light-beam 106 from the IC wafer 103. An electronic circuit 108 can be configured to receive and analyze a signal from the detector 107 (the signal based on the output light-beam 106 received by the detector 107). To improve inspection contrast, a WGP 104 (according to an embodiment described herein) can be located in, and can polarize, the output light-beam 106.

Photo Alignment

The WGPs described herein can be used in the manufacture of flat panel displays (FPDs for plural or FPD for singular). FPDs can include an aligned polymer film and liquid crystal. An FPD manufacturing tool 110 is shown in FIG. 11, comprising a light source 111, a stage 112 for holding an FPD 113, and a WGP 114 (according to an embodiment described herein). The light source 111 can emit ultraviolet light 115. The WGP 114 can be located between the light source 111 and the stage 112 and can polarize the ultraviolet light 115.

Exposing the FPD 113 to polarized ultraviolet light 115 can align the polymer film. See U.S. Pat. Nos. 8,797,643 and 8,654,289, both incorporated herein by reference. Exposing the FPD 113 to polarized ultraviolet light 115 can help repair the FPD 113. See U.S. Pat. No. 7,697,108, which is incorporated herein by reference.

Methods A method of making a WGP can include some or all of the following steps.

The steps can be performed in the order shown, or alternate order:

1. Obtaining ribs 12 located over a surface of a transparent substrate 11. The ribs 12 and the transparent substrate 11 can have properties as described above. There can be gaps G between at least a portion of the ribs 12. See FIG. 6.
2. Exposing the WGP to ultraviolet light and/or ozone:
   a. This step may be done before applying one or more of the following: a proximal conformal-coating $13_p$, a middle conformal-coating $13_m$, and a distal conformal-coating $13_d$.
   b. Exposing the WGP to ultraviolet light and ozone can be done sequentially or simultaneously.
   c. A duration of this step can be less than two minutes in one aspect or less than 20 minutes in another aspect.
3. Applying a proximal conformal-coating $13_p$. See FIGS. 2-3.
4. Applying a middle conformal-coating $13_m$. See FIG. 3.
5. Plasma cleaning the WGP.
   a. Plasma cleaning can generate more reactive groups on the surface (i.e. surface of the ribs 12, proximal conformal-coating $13_p$, or middle conformal-coating $13_m$), thus improving bonding of the distal conformal-coating $13_d$.
   b. Non-limiting examples of plasmas include $O_2$, $H_2$, Ar, and $N_2$.
   c. Plasma cleaning can be performed at various temperatures, such as for example between 140° C. and 200° C.
   d. One plasma, used for cleaning the WGP, included $O_2$ (flow rate 15 sccm) and $H_2$ (flow rate 10 sccm) at a power of 400 W for 5 minutes at a temperature of 160° C.
6. Exposing the WGP to a gas.
   a. The gas can include water vapor. The water vapor can have a pressure of less than 100 Torr.
   b. This step can increase the number of hydroxyl groups on the underlying surface (e.g. ribs 12, proximal conformal-coating $13_p$, or middle conformal-coating $13_m$), which can improve bonding of phosphonate of the hydrophobic-layer.
   c. Duration, pressure, and temperature of this step may need to be carefully limited, depending on the rib structure and the nature of the underlying surface, in order to avoid corrosion.
7. Applying a distal conformal-coating $13_d$.
8. Baking the WGP. Baking can improve bonding of the hydrophobic-layer.
   a. Baking temperature examples: The WGP can be baked at greater than between 100° C. in one aspect, greater than 130° C. in another aspect, or greater than 150° C. in another aspect; and less than 300° C. in one aspect, less than 320° C. in another aspect, or less than 400° C. in another aspect.
   b. Baking time examples: The WGP can be baked for at least 5 minutes, at least 10 minutes in another aspect; and less than 60 minutes in one aspect or less than 90 minutes in another aspect.
   c. Baking at 150° C. for 15 minutes has been successful.

One, two, or every layer of the conformal coating (the proximal conformal-coating $13_p$, the middle conformal-coating $13_m$, and/or the distal conformal-coating $13_d$) can have one or more of the following characteristics:

1. can cover the underlying layer, e.g. an exposed surface of the ribs 12, the proximal conformal-coating $13_p$, or middle conformal-coating $13_p$;
2. can be applied by atomic layer deposition, vapor-deposition, or other anhydrous deposition method;
3. can be applied at an elevated temperature, such as for example at least 300° C. in one aspect, at least 350° C. in another aspect, at least 400° C. in another aspect; and less than 500° C. in one aspect or less than 600° C. in another aspect;
4. can include a metal oxide;
5. can include hafnium oxide, zirconium oxide, aluminum oxide, silicon oxide, silicon nitride, silicon oxynitride, a rare earth oxide, or combinations thereof.
6. can be applied by exposing the WGP to a chemical, the chemical including $Si(R^1)_d(R^2)_e(R^3)_g$, $(R^1)_iPO(R^4)_j(R^5)_k$, or combinations thereof, where:

a. d is 1, 2, or 3, e is 1, 2, or 3, g is 0, 1, or 2, and d+e+g=4;
b. i is 1 or 2, j is 1 or 2, k is 0 or 1, and i+j+k=3;
c. each $R^1$ is independently a hydrophobic group;
d. $R^2$ is a silane-reactive-group;
e. each silane-reactive-group is independently selected from: —Cl, —$OR^6$, —$OCOR^6$, —$N(R^6)_2$, and —OH;
f. $R^4$ is a phosphonate-reactive-group;
g. each phosphonate-reactive-group is independently selected from: —Cl, —$OR^6$, —$OCOR^6$, and —OH; and
h. each $R^6$ is independently an alkyl group, an aryl group, or combinations thereof.

The hydrophobic group, the phosphonate-reactive-group, the silane-reactive-group, $R^6$, $R^3$, and $R^5$ can have the properties as described above. The silane chemical and the phosphonate chemical can be applied sequentially or simultaneously.

What is claimed is:

1. A wire grid polarizer (WGP) comprising:
    ribs located over a surface of a transparent substrate with gaps between adjacent ribs; and
    a silane conformal-coating located over the ribs, the silane conformal-coating including chemical formula (1), chemical formula (2), or combinations thereof:

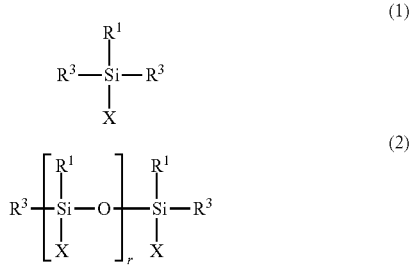

where: r is a positive integer; each $R^1$ independently is a hydrophobic group including $CF_3(CF_2)_n(CH_2)_m$, and n and m are integers within the boundaries of 1≤n≤4 and 1≤m≤5; each X is a bond to the ribs; and each $R^3$ is independently a chemical element or a group.

2. The WGP of claim 1, wherein the silane conformal-coating is a superhydrophobic surface, capable of keeping water on a surface of the ribs in a Cassie-Baxter state.

3. The WGP of claim 1, wherein $R^3$ is —$OCH_3$.

4. The WGP of claim 1, wherein $R^3$ is —$OCOR^6$, and each $R^6$ is independently an alkyl group, an aryl group, or combinations thereof.

5. The WGP of claim 1, wherein $R^3$ is —$N(R^6)_2$, and each $R^6$ is independently an alkyl group, an aryl group, or combinations thereof.

6. The WGP of claim 1, further comprising a silicon dioxide conformal-coating between the silane conformal-coating and the ribs.

7. The WGP of claim 6, wherein the silicon dioxide conformal-coating has a thickness of between 0.1 nanometers and 5 nanometers.

8. The WGP of claim 6, wherein a minimum thickness of the silicon dioxide conformal-coating is at least 0.5 nanometers.

9. The WGP of claim 6, wherein a maximum thickness across the entire silicon dioxide conformal-coating is less than 10 nanometers.

10. A wire grid polarizer (WGP) comprising:
    ribs located over a surface of a transparent substrate with gaps between adjacent ribs; and
    a silane conformal-coating located over the ribs, the silane conformal-coating including chemical formula (1), chemical formula (2), or combinations thereof:

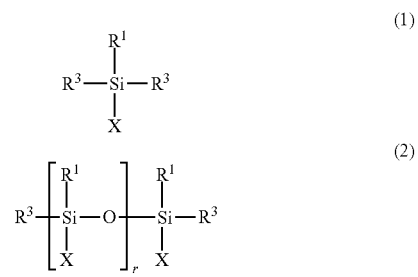

where: r is a positive integer; each $R^1$ independently is a hydrophobic group including $CF_3(CF_2)_n$, and n is an integer within the boundaries of 1≤n≤3; each X is a bond to the ribs; and each $R^3$ is independently a chemical element or a group.

11. The WGP of claim 10, wherein each $R^1$ is independently $CF_3(CF_2)_n(CH_2)_m$, and m is an integer within the boundaries of 1≤m≤5.

12. The WGP of claim 10, wherein the silane conformal-coating is a superhydrophobic surface, capable of keeping water on a surface of the ribs in a Cassie-Baxter state.

13. The WGP of claim 10, wherein each $R^3$ is —$OCH_3$, —$OCOR^6$, and —$N(R^6)_2$, and each $R^6$ is independently an alkyl group, an aryl group, or combinations thereof.

14. The WGP of claim 10, further comprising:
    a silicon dioxide conformal-coating between the silane conformal-coating and the ribs; and
    across the entire the silicon dioxide conformal-coating, the silicon dioxide conformal-coating has a minimum thickness of at least 0.5 nanometers and a maximum thickness of less than 10 nanometers.

15. A method of making a wire grid polarizer (WGP) with a protective coating, the method comprising:
    providing a WGP with ribs located over a surface of a transparent substrate;
    exposing the WGP to a silane chemical by vapor-deposition, the silane chemical including $Si(R^1)_d(R^2)_e(R^3)_g$ where: d is 1, 2, or 3, e is 1, 2, or 3, g is 0, 1, or 2, and d+e+g=4; each $R^1$ is independently a hydrophobic group including $CF_3(CF_2)_n$ and n is an integer within the boundaries of 1≤n≤4; $R^2$ is a silane-reactive-group; each silane-reactive-group is independently selected from: —$OR^6$, —$OCOR^6$, and —$N(R^6)_2$; each $R^6$ is independently an alkyl group, an aryl group, or combinations thereof; and each $R^3$, if any, is independently any chemical element or group.

16. The method of claim 15, wherein n is an integer within the boundaries of 1≤n≤3.

17. The method of claim 15, wherein each $R^1$ is independently $CF_3(CF_2)_n(CH_2)_m$, and m is an integer within the boundaries of 1≤m≤5.

18. The method of claim 15, wherein the silane-reactive-group is —$OCH_3$.

19. The method of claim 15, wherein the silane-reactive-group is —$OCOR^6$.

20. The method of claim 15, wherein the silane-reactive-group is —$N(R^6)_2$.

* * * * *